April 26, 1960 V. L. RONCI 2,934,588

SEMICONDUCTOR HOUSING STRUCTURE

Filed May 8, 1958

INVENTOR
V. L. RONCI
BY
H W Lockhart
ATTORNEY

United States Patent Office 2,934,588

Patented Apr. 26, 1960

2,934,588

SEMICONDUCTOR HOUSING STRUCTURE

Victor L. Ronci, Zionsville, Pa., assignor to Bell Telephone Laboratories, Incorporated, New York, N.Y., a corporation of New York Application May 8, 1958, Serial No. 734,053

1 Claim. (Cl. 174—50.5)

Figure 1:
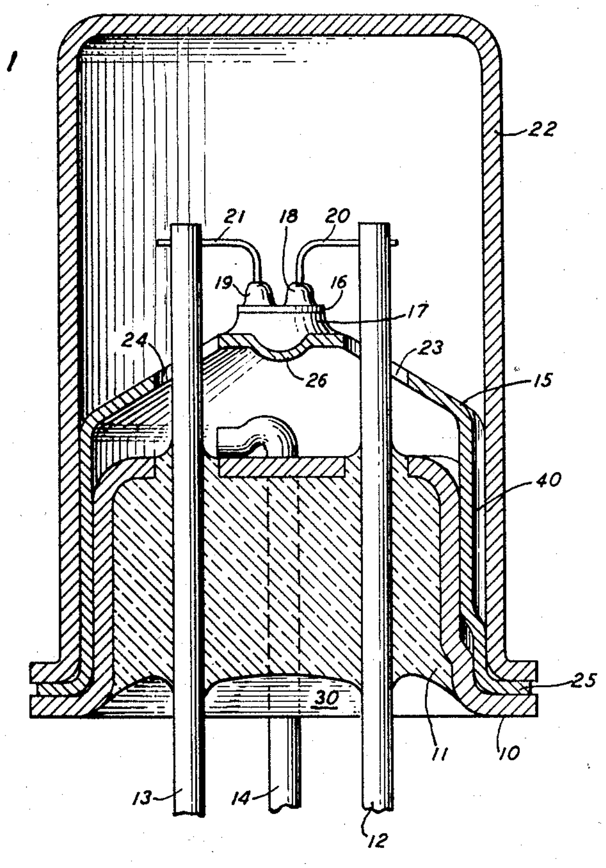

This invention relates to semiconductive devices and, more specifically, to mounting and encapsulating structures therefor.

Housing and mounting structures for semiconductor devices, such as transistors and varistors, have evolved in a variety of types. However, the so-called can type of hermetically sealed enclosure, as shown, for example, in United States Patent 2,796,563, issued June 18, 1957, to J. J. Ebers and J. J. Kleimack, has been widely adopted. Such an enclosure comprises a header or base member from which the semiconductor elements are supported and a metal can or housing which is welded to a metal portion of the header to provide a hermetic seal. The header member usually includes a glass insulating portion involving a number of glass-to-metal seals and the header consequently is a relatively complex and costly component of the encapsulation. Furthermore, in semiconductor devices capable of handling relatively large amounts of power, it is necessary to dissipate internally generated heat. Generally, the metals and alloys most advantageous for making good glass-to-metal seals are less desirable from the standpoint of heat conduction.

In view of the foregoing considerations, objects of this invention are to facilitate the mounting and encapsulation of semiconductive devices, to reduce the cost of such mounting and encapsulation, and to improve the electrical characteristics of such devices by enhancing the heat dissipation characteristics thereof.

A feature of this invention is a cup-shaped metallic member for mounting a semiconductor wafer independently of the header member and the enclosing can member. This mounting member is of a metal, such as copper, having high heat conductivity and is designed to be joined securely by welding to the header and the can member.

Customarily, the semiconductor element is tested to determine its electrical characteristics after final cleaning and etching operations and prior to encapsulation. In the past, using housings of the type exemplified in the above-noted patent to Ebers and Kleimack, rejection of the semiconductor element at this stage of fabrication occasions the discarding also of the relatively complex and expensive header member to which the semiconductor structure is secured. However, in the structural arrangement in accordance with this invention, failure of the semiconductor element to meet electrical requirements at this same stage results in loss of only the relatively simple and inexpensive mounting member.

A further feature resides in the inclusion of one or more longitudinal mating grooves pressed into the mounting member and into the metal portion of the header member to insure proper orientation of one member relative to the other. This feature insures that the stems or leads from the header will be positioned correctly within the openings provided in the mounting member.

Figure 2:
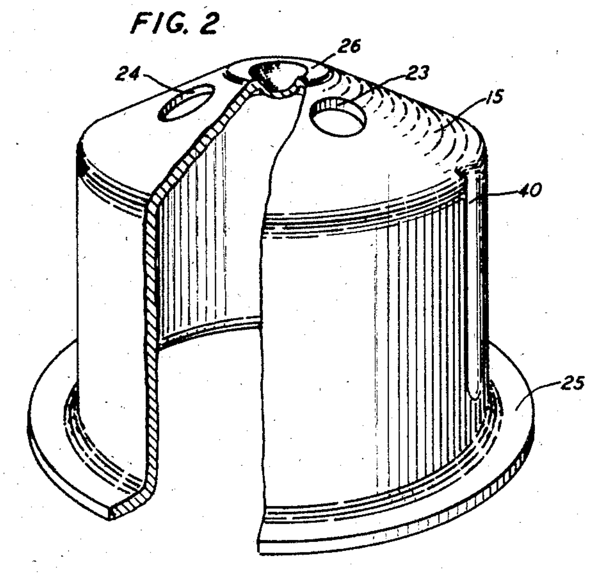

The invention and its further objects and features will be more clearly understood from the following detailed description taken in connection with the drawing in which:

Fig. 1 is a cross section of a typical alloy junction transistor in a hermetically sealed encapsulation and including the mounting member in accordance with this invention; and Fig. 2 is a perspective view, partially in section, of the mounting member included in the structure of Fig. 1.

In Fig. 1 the encapsulating and mounting structure comprises three elements: the header member 30, the mounting member 15, and the can 22. The header member 30 comprises an inverted cuplike metal element 10 containing a portion of glass 11 within the cavity thereof. Typically, the metal element 10 is of an iron, nickel and cobalt alloy suitable for making glass-to-metal seals. Sealed within the glass portion by fusion and insulated thereby from the cup member 10 are metal stem members 12 and 13. A third stem member 14 is secured within the glass portion but in contact with the metal portion of the header to provide the third electrode.

The metal mounting member 15 is designed to fit closely over the header member and is arranged with holes 23 and 24 to permit passage of the stem members 12 and 13 through the mounting member 15. The mounting member 15 advantageously may be of copper, as previously mentioned, or other metal having a relatively high heat conductivity and which is readily formed, such as by a drawing operation. The semi-conductive element comprising a wafer 16, typically of germanium or silicon having a number of fused contacts thereto, is centrally disposed on the mounting member 15. In the structure depicted, the portion 17 may comprise, in the case where the wafer 16 is of N-type germanium, a soft solder composed of an element of lead and indium to produce a P-type collector region within the germanium wafer 16. The metal button 19 on the upper face of the wafer, likewise, may be of a lead-indium solder to produce a P-type emitter region and the button 18 may be a lead-antimony button providing an ohmic contact to the N-type base region of wafer 16. Thus, in the arrangement described, the portion 17 comprises a collector electrode to which external connection is made through the stem 14 to the metal header and mounting member 15. The button 19 and electrode lead 21 furnish the emitter connection to stem member 13; and the button 18, electrode lead 20, and stem 12 function as the base connection.

The can member 22, which may be of steel or aluminum or the like, is fitted over the nested mounting and header members and the three elements finally welded together through the flange portions. In connection with this welding operation, it is particularly advantageous that the mounting member is of a material appreciably softer than the header and can members. This is for the reason that the pressure of the welding electrodes in combination with the heat insures plastic flow of the mounting member flange between the two outer members, enhancing the formation of a strong hermetic seal. Further, the thermal gradients induced by the welding operation are such as to preclude contaminating effects such as spattering of metal within the enclosure. In some designs a tubulation may be provided either through the header member or the can to enable evacuation or gas filling of the encapsulation just prior to sealing.

In the alloy junction structure of Fig. 1 at even moderate power levels, a considerable amount of heat is dissipated from the collector junction through the collector region 17. The removal of this heat is facilitated by provision of the cuplike mounting member 15 which is in close contact with the outer can member 22 over a considerable area. Thus, heat flowing from the semiconductor element is radiated from the outer member of the enclosure more efficiently than in the conventional structure.

Fig. 2 shows the cuplike mounting member 15 in greater detail. Thus, the pedestal portion 26 includes a depression to facilitate the solder mounting of the semiconductor element. The holes 23 and 24 are provided to permit passage of the stem members 12 and 13 through the mounting member without making short circuit contact to the housing. The flange portion 25 is advantageously shaped to conform to the flanges of the header and can members. The longitudinal indentation 40 matches a similar indentation in the metal portion 10 of the header 30. It can be appreciated that this structure is particularly suitable for an automatic or semi-automatic assembly operation because the mounting and encapsulating members nest together in accordance with this registration device. After the mounting member 15 is positioned over the header 30, the leads 20 and 21 are secured to the stems 12 and 13, respectively, by welding. Next the can 22 is positioned over the mounting member 15 and a welding operation through the flange portions of all three elements joins them together and provides a hermetic seal. In a typical semiconductor housing for an alloy junction transistor, the mounting member may have an external diameter to the outside of the flange portion of slightly less than .2 inch and a height of approximately .14 inch.

Furthermore, the mounting member 15 is an advantageous structure not only from the standpoint of increased heat dissipation and automatic assembly operations but also from the standpoint of economy. In manufacture, the semiconductive element comprising the wafer 16 and emitter, base, and collector electrodes, is attached to the mounting member by soldering the collector electrode 17 in the pedestal depression 26. The semiconductive element is then subjected to final chemical and cleaning etching and then is tested electrically. Failure to meet electrical requirements at this stage of assembly results in the discarding of the semiconductor element and the relatively inexpensive metal mounting member rather than the more expensive and complex metal and glass header having fused-in stems and attached mounting structure.

Although the invention has been disclosed in connection with an alloy junction transistor, it is not limited to such an arrangement. For example, semiconductor diodes and transistors of the diffused junction type may be mounted in the above-described housing by making minor changes to the shape of the pedestal portion 26 of the mounting member 15. The advantages recited heretofore in connection with the alloy junction structure are applicable equally to these other semiconductor structures.

Also, although a specific embodiment of this invention has been shown and described, it will be understood that it is but illustrative and that various modifications may be made therein without departing from the scope and spirit of this invention.

What is claimed is:

In a semiconductor encapsulation comprising a header member and a housing member, an intermediate metallic member for mounting the semiconductor element, said intermediate member being sealed in nested arrangement between said header member and said housing member in intimate area contact therewith thereby enabling thermal conduction, said intermediate member being free of bonded elements other than the semiconductor element, said intermediate member having a cuplike configuration including a conelike portion having apertures therethrough for passage of electrical conductors, said member having a pedestal portion atop said conelike portion for mounting the semiconductor element.

References Cited in the file of this patent

UNITED STATES PATENTS 2,238,025 Miller ---------- Apr. 8, 1941
2,825,014 Willemse ---------- Feb. 25, 1958